United States Patent [19]
Allen et al.

[11] Patent Number: 6,028,497
[45] Date of Patent: Feb. 22, 2000

[54] RF PIN GRID ARRAY

[75] Inventors: Barry R. Allen; Edwin D. Dair, both of Redondo Beach; Randy J. Duprey, Manhattan Beach, all of Calif.

[73] Assignee: TRW Inc., Redondo Beach, Calif.

[21] Appl. No.: 09/014,556

[22] Filed: Jan. 28, 1998

[51] Int. Cl.$^7$ ..................................................... H01P 1/00
[52] U.S. Cl. ........................ 333/246; 257/698; 257/728; 333/26; 333/260; 439/63
[58] Field of Search .............................. 333/26, 246, 247, 333/260; 257/664, 698, 699, 728; 439/63

[56] References Cited

U.S. PATENT DOCUMENTS

| | | | |
|---|---|---|---|
| 5,045,820 | 9/1991 | Leicht et al. | 333/26 |
| 5,202,648 | 4/1993 | McCandless | 333/26 |
| 5,266,912 | 11/1993 | Kledzik | 333/247 |
| 5,668,408 | 9/1997 | Nicholson | 257/699 |

*Primary Examiner*—Paul Gensler
*Attorney, Agent, or Firm*—Michael S. Yatsko; Ronald M. Goldman

[57] ABSTRACT

A hermetic RF pin grid array package methodology is described that obviates the need for glass to metal feedthroughs, simplifying construction, improving reliability and reducing the cost of RF multi-chip modules. An array of cylindrical passages (13, 15) through the module's base plate (3) are aligned with and receive respective associated conductor pins (7, 9) depending from the module substrate (1). Cylindrical metal shrouds (11) are positioned within some passages (15) combine with associated pins (9) to define coaxial RF transmission lines and support for an external RF coax coupling. Unshrouded pins (7) serve to connect DC to the integrated circuit chips in the module. Waveguide interfaces, if required, are provided by conductive coupling structures patterned on the substrate, suspended over a waveguide (17) formed in or about the baseplate. The compartmentalized seal ring (5) attached to the top surface of the substrate provides a metal framework that divides the interior area, providing individual compartment for the distinct RF circuits in the module, including the integrated circuit chips associated with each such RF circuit.

6 Claims, 5 Drawing Sheets

RF PIN GRID ARRAY

FIELD OF THE INVENTION

This invention relates to multi-chip module packages for millimeter microwave circuits, and, more particularly, to a new module package construction that enhances manufacturing efficiency, minimizes the physical size of a multi-chip package and eliminates glass feed throughs.

BACKGROUND

Multiple solid state RF electronic devices, such as integrated circuits, that provide individual circuit functions at RF frequencies, such as millimeter microwave frequencies, are often housed together in a single closed metal-walled package or, as variously termed, multi-chip module. The package or module is typically hermetically sealed and protects the confined electronic devices from the external environment, which sometimes contains radiation, corrosive gases or other material harmful to the confined devices. To carry RF signals through the package's metal wall between the module's interior and exterior, RF feed-throughs that are integral with the module are employed. In essence, the feed-through is a very short RF transmission line. It is the means conventionally used to propagate RF energy through an RF barrier, such as a metal wall. The feed-through typically connects to RF connectors or radiates into waveguides attached to the package exterior.

Typically feed-throughs have been constructed of glass and metal. The glass, referred to as a glass bead, located in a hole in a package wall, serves as an insulating support and dielectric that maintains a straight metal pin, the transmission line conductor, in electrically insulated relationship with the package walls and serves as an impervious barrier to the external environment. A single glass bead may support multiple pins.

Despite its effectiveness, the glass-to-metal seals suffer an important drawback: they are not durable. The glass is brittle. If the feed-through's glass encased metal pin is deflected, bent or deformed during handling or testing, glass particles are broken at the glass meniscus surrounding the pin. That breakage compromises the integrity of the feed-through. In some cases, radial cracks or circumferential cracks appear in the glass. Those cracks might be due to differences in thermal expansion characteristics between the glass and the pin, or some form of fatigue or from other causes, which remain unknown.

However, once even a small crack appears, the crack may propagate with repeated thermal cycling as occurs during normal use of the electronic apparatus containing the package. Once crack propagation occurs, mechanical movement of the package or mechanical stresses resulting from handling, shipping, aircraft or spacecraft vibration may aggravate the cracks and the feed-through begins to noticeably leak. Being aware of the glass's fragility, those skilled in fabricating devices containing those RF feed-throughs necessarily take extra care in handling to ensure the integrity of the product, which drags down manufacturing efficiency. As an advantage, the present invention eliminates all glass to metal feed throughs from the multi-chip module package.

In those prior multi-chip modules, it was not practicable to assemble all of the integrated circuit chips of the different RF circuits upon a single substrate, an indirect consequence in part of the use of glass to metal feed throughs. The multiple RF circuits within a chip module were fabricated on separate substrates. The metal housing base was machined to carve out from a metal block the separate RF isolating compartments, accessible from the top of the base. These separate substrates were separately placed into the respective compartments within the metal housing and soldered in place. The metal base was both expensive to produce and larger in size than desired.

As a further advantage, the present invention permits fabrication of all of the RF circuits upon a single substrate, increasing manufacturing efficiency, reliability and, importantly, decreasing fabrication costs. The invention eliminates the need to carve out separate RF compartments within the metal base, further reducing fabrication cost.

Accordingly, an object of the present invention is the elimination of glass feed throughs in multi-chip millimeter wave integrated circuit packages.

A further object of the invention is to reduce the physical size and cost of millimeter microwave multi-chip modules.

And a still further object of the invention is to enhance the reliability and manufacturing efficiency of multi-chip modules.

The digital semiconductor chip packaging art is known to employ an array of pins, referred to as a pin grid array, to carry the power supply voltages and communicate digital data between the semiconductor chip and other apparatus exterior to that chip. In that field the pin grid array offers, among other things, the opportunity to increase the density of electrical contacts and/or permit greater miniaturization of the chip assembly. Accordingly, an additional object of the invention is to adapt such pin grid away technique to the construction of millimeter wave multi-chip modules and to provide thereby a new RF pin grid array.

In preparing the present record of the invention, applicant was made aware of a U.S. patent to Nicholson, issued Sep. 16, 1997, filed Apr. 12, 1996, entitled "Pin Grid Array Solution for Microwave Multi-Chip Modules". Nicholson offers the concept of having a pin grid array type package as a means to increase the density of external connections to the module and offers a package construction that incorporates both depending pins in the substrate for DC and RF transmission and adhesive between the package lid and substrate and between the substrate and base that are intended to address differential expansion problems between the package and due to the sideways flexure allowed by the pins.

In that structure the pins are of identical size, 0.020 inches in diameter with a slightly larger 0.028 inch diameter mounting pedestal for interface with a SMA connector. The pins extend from the top surface of the substrate where anchored, through the thickness of the substrate, out the bottom end of the substrate, and through corresponding pin passages through the metal base from which the pins protrude. Nicholson notes that in extending through passages in the metal base the pins and the surrounding metal passage wall form coaxial airline structures.

The completed package is then bolted to a PC board with a conductive gasket in between and the extending pins are then soldered to the backside of the PC board at the locations at which they protrude through. And a metal backplate that is threaded to accept SMA connectors is then bolted to the backside of the PC board, also with a gasket in between.

Although Nicholson's technique for adapting pin grid array structure to a multi-chip module is interesting, it employs adhesives and thus does not include any capability for hermeticity, a characteristic known to provide the greatest reliability and operational life. Moreover, to accommodate integrated circuits of higher power Nicholson must cut away the supporting substrate and rest the integrated circuit on the metal plate underlying the substrate in order to provide a sufficient thermally conductive path to a heat sink and avoid thermal damage to the integrated circuit. It may also be noted that Nicholson does not incorporate a waveguide within the multi-chip module or a microstrip to waveguide transition, an ancillary feature of the present invention. As becomes apparent from the description which follows, the present invention offers an alternative solution, one that permits a package of simpler structure and of a more compact physical size, hermeticity and waveguide transitions.

Accordingly, an additional object of the invention is to provide RF feed-throughs through waveguide transitions in a multi-chip module for coupling RF to a waveguide.

It is a still additional object of the invention to ensure hermeticity in the feed-through for greatest operational life.

And it is an ancillary object of the invention to provide a new multi-chip module that eliminates the need to include cut out sections in the substrate in which to mount integrated circuits and permits heat to conduct from the integrated circuits through the substrate in all instances.

SUMMARY OF THE INVENTION

The present invention integrates a circuit supporting flat rigid dielectric substrate, suitably aluminum oxide ceramic, containing conductors on a top surface that are to define RF circuits, an array of electrical DC and RF feed throughs, electrical conductors sometimes herein referred to as pins, and a metal base plate assembled into a unitary assembly. From ends that are attached to the substrate at appropriate circuit junctures on the substrate, the pins extend outwardly perpendicular to the substrate's flat bottom surface into passages formed in the base plate, presenting an array of conductor pins.

The metal base plate covers the underside surface of the substrate and provides an electrically conductive RF shield for the substrate's bottom side. An array of cylindrical passages through the base plate's thickness are aligned with respective associated pins in the pin array and receive those pins. Cylindrical metal shrouds are positioned within those base plate passages that are to serve as part of a formed RF coaxial transmission line and provide a support for an external RF coax coupling. The internal walls of the shroud are profiled or stepped to ensure that the formed coaxial transmission line contains the desired characteristic electrical impedance characteristic. The pins that remain unshrouded serve to connect DC through the base plate. Essentially an RF pin grid array is defined that is interspersed with a DC pin grid array.

A seal ring to the several separate RF circuits disposed on the top surface of the substrate also provides a metal framework that divides the interior area bounded by the seal ring's outer walls into separate metal walled compartments, providing individual compartment for the separate RF circuits, including the integrated circuit chips associated with each such RF circuit. When fully packaged, an electrically conductive lid covers the seal ring and hermetically seals the elements within the confines of the ring's walls. With a metal base and lid, each metal walled compartment is essentially RF isolated from adjacent compartments. As a specific aspect to the present invention such seal ring may be cast to the desired shape, avoiding machining operations.

Further, by design the conductors that form part of the RF circuit structure contained on the substrates upper surface is an RF transmission line, typically a microstrip line, and possesses a characteristic line impedance $Z_0$. That line connects to an associated electrical via that in turn connects to one of the RF pins on the substrate's underside. To ensure the lowest possible VSWR, the coaxial transmission line formed with such pin and the accompanying metal shroud possesses the same characteristic impedance.

An ancillary RF feed through invention is also presented for any of the foregoing multi-chip modules that may also require waveguide interfaces. In this hermetic transitions from the internal microstrip-to-waveguide are achieved using a patterned conductor on the substrate over a baseplate waveguide. Waveguides formed in the base plate underlying the substrate and microwave cavities in the seal ring overlying the substrate are hermetically sandwiched together in line with the patterned conductor, with the latter two elements defining a microstrip to waveguide transition. The latter structure eliminates the prior practice of employing a glass feed-through to radiate directly into a waveguide and does not require the depending pin used in the RF coaxial transmission line of the aforedescribed RF pin grid array invention.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DESCRIPTION OF THE PREFERRED EMBODIMENTS

Figure 1:
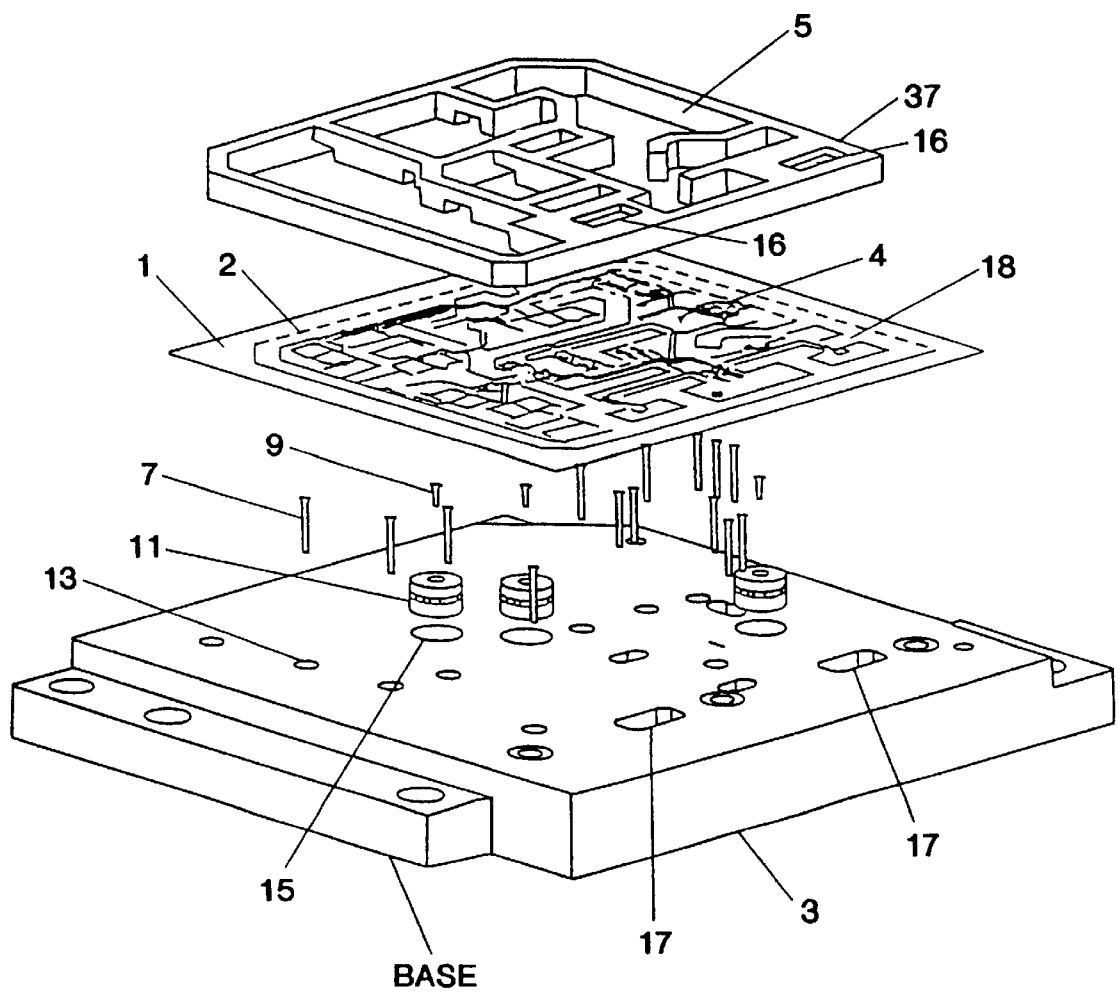
FIG. 1 illustrates an embodiment of the invention in exploded view.

Reference is made to FIG. 1, which is an exploded view of a high frequency multi-chip integrated circuit assembly that incorporates the RF pin grid array. The assembly includes a flat stiff electrical insulator, suitably aluminum oxide, that serves as the substrate 1, a metal base 3, and a seal ring 5. A flat electrically conductive lid, not illustrated, is fastened to the top of the seal ring to cover the seal ring and complete the assembly.

Figure 2:
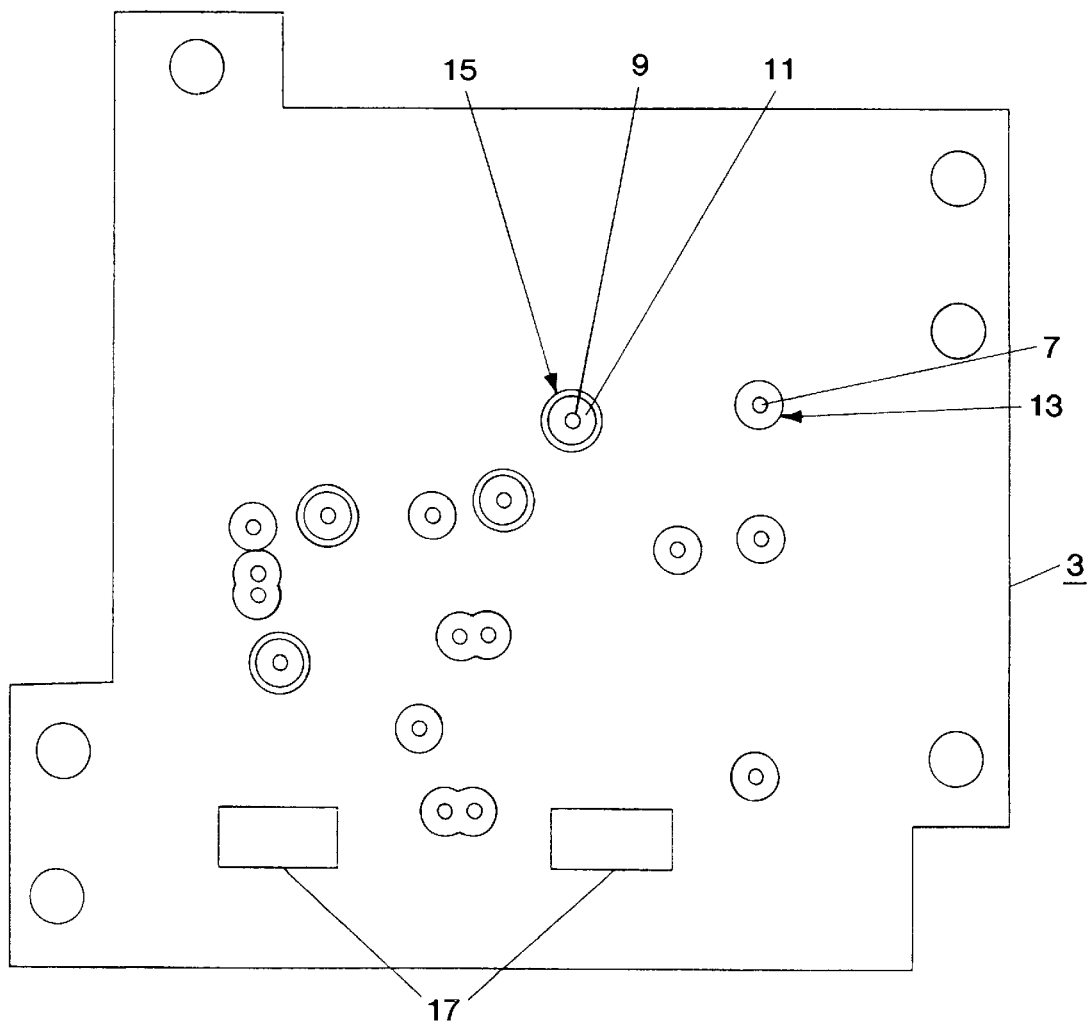
FIG. 2 illustrates the embodiment of FIG. 1, as assembled, in bottom view.

The embodiment also contains a number of metal "pins" arrayed in a predetermined configuration over the bottom surface of substrate 1, which is the basis for the term pin grid array. These include pins 7 that number fourteen in the figure, and pins 9 that number four. A metal cylinder or shroud 11 is associated with each of pins 9. The longer pins 7 serve as DC conductors. The shorter pins 9 serve as the center conductor of a coaxial RF transmission line, while the associated metal cylinder 11 serves as the lines outer conductor. The pins are attached by solder or brazing material to appropriate metal pads formed on the underside of substrate 1, which supports them. These elements are described at greater length hereafter in connection with FIGS. 2 and 3.

As is conventional practice, a plurality of integrated circuit chips, such as semiconductor chips 2 and 4, only two of which are labeled in the figure, are mounted atop the substrate and interconnect to formed electrical conductors patterned on the top. Further, electrical vias provide electrically conductive circuit paths that extend from the underside of the substrate to the top side and interconnect with the appropriate electrical paths of the defined circuits. That path permits transmission of the DC current necessary to supply operating power to the devices and transmission of high frequency RF currents to and/or from external sources.

The integrated circuit chips and conductors form high frequency RF circuits, suitably operating in the millimeter microwave frequency ranges. Those circuits are known and it is recognized that the details of the RF circuits are not relevant or material to an understanding of the present invention. Although providing context to the present invention, the RF circuits formed by the integrated circuit chips need not be illustrated or described in greater detail.

Substrate 1 is formed of dielectric material, suitably aluminum oxide, into a flat sheet that is strong and rigid and essentially impervious to corrosive gas and/or other vapors. Cylindrical passages formed through the thickness of the substrate are fully filled and sealed with deposited electrically conductive material, termed vias, not illustrated in FIG. 1, that provide an electrical path between the top and bottom surfaces of the substrate. Properly formed and sealed to the passage walls, the vias ensure that the passages remain relatively impervious to corrosive gas and other vapors. For Integrated Circuit chips that dissipate higher powers, beryllium oxide (BeO), an excellent thermal heat sink, may be substituted for the alumina material.

The substrate is assembled into place atop the base 3. A number of passages, such as passages 13 and 15 are formed through base 3, suitably by drilling and/or machining. Passages 13 and 15 are distributed about the surface of the plate. At a minimum the number of such passages at least equals the number of pins 7 and 9. The distribution of those passages is in the same array as that of the pins, so that each passage is coaxial with an associated one of the pins extending down from substrate 1, such as is illustrated in the bottom plan view of FIG. 2 to which reference is made. Passages 17 are also machined through the module's metal base and serve as rectangular waveguides, later herein described. Various bolt passages are formed as appropriate in the base surfaces to permit fastening the module to a motherboard or other support.

The diameter of the circular base passages are sufficiently greater than the diameter of the pin thereby providing clearance and ensuring DC isolation from the passage walls. The small diameter passages, such as 13, permits the associated pin, such as pin 7, to be positioned therein without contact with the metal passage walls. The larger diameter passages 15 are of a diameter sufficient to permit insertion of the cylindrical metal shroud, such as shroud 11, with frictional engagement with the respective passage wall. The shroud contains features internally that, in combination with pin 9, form an interface that is compatible with commercially available RF connectors, including snap-in, SMA and higher frequency connectors, as later herein described. Some of the base passages are larger in size and oblong in appearance to permit two or more pins to extend from the substrate into the passage with sufficient clearance so as to avoid contact with the passage walls. The latter pins are used for transmission of DC voltages, and not RF energy.

Returning to FIG. 1, the back end of metal shroud 11 contains a central circular opening. That circular opening is sufficiently large in size to permit insertion of the associated RF pin, such as 9, coaxially, without physical contact with the metal shroud.

Figure 5:
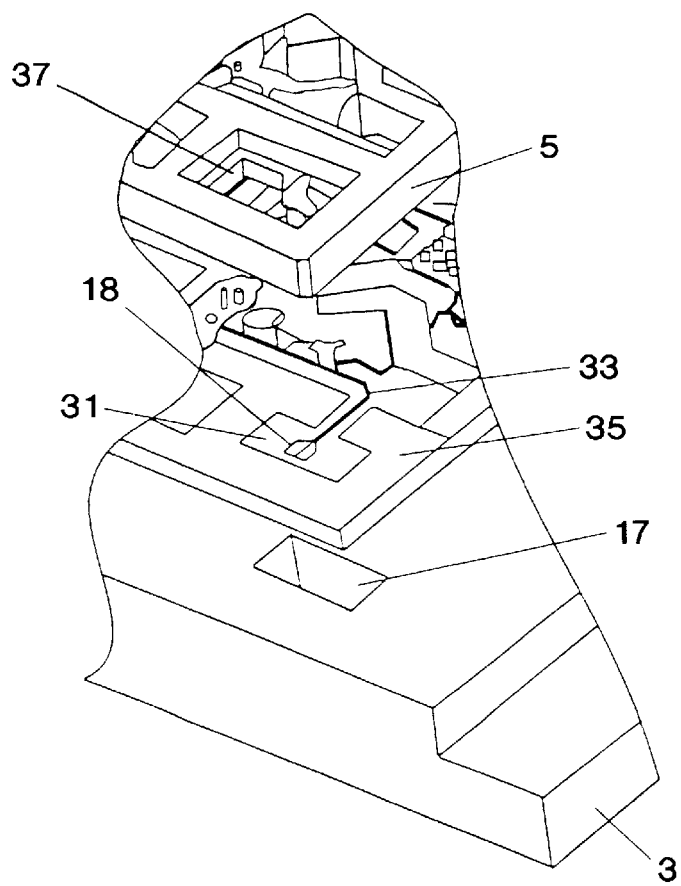
FIG. 5 is an exploded enlarged view of the lower right corner of FIG. 3, illustrating a portion of the module containing a microstrip to waveguide transition.

Rectangular shaped passages 17, two of which are illustrated in this embodiment, form rectangular waveguides that provide for transmission of microwave RF to and from the circuits mounted upon substrate 1. Design specific conductor patterns 18 on top and bottom of the substrate interact to create a coupling structure that transmits or receives a signal into or out of the waveguide, transitioning the waveguide to the internal microstrip circuits. This is described in greater detail later herein in connection with FIGS. 5 through 7. It is appreciated that the foregoing waveguide coupling structure also eliminates the need for a glass feed-through at this interface.

Figure 3:
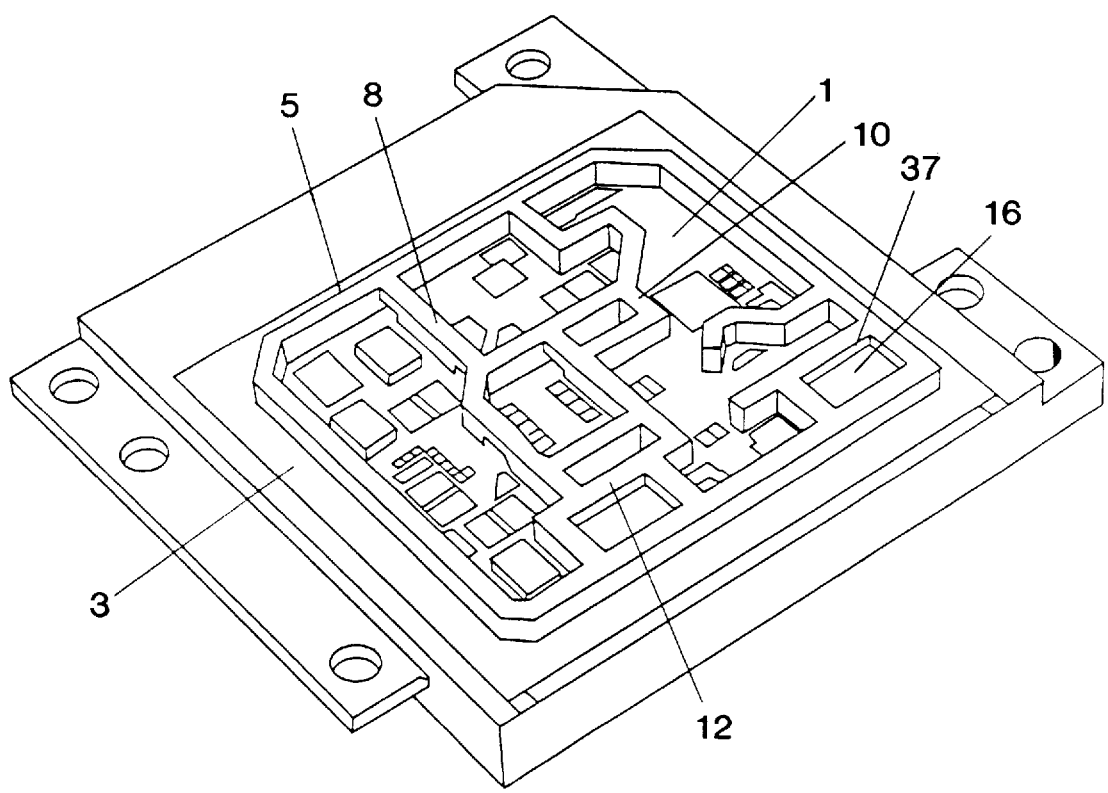
FIG. 3 is a top perspective view the embodiment of FIG. 1, as assembled.

With pins 7 and 9 projecting from the underside surface of substrate 1, metal shrouds 11 installed, base plate 3 and seal ring 5 assembled together, as illustrated by the top perspective view of FIG. 3, the substrate fits neatly into the base and, with the overlying ring seal 5, forms a thin relatively flat assembly.

As further illustrated in FIG. 3, seal ring 5 is assembled to the underlying circuit substrate, the bottom edge of the ring seal's outer wall is hermetically sealed to the substrate, suitably by brazing or soldering. The seal ring's outer wall extends continuously in a loop about the top surface of substrate 1 to border and define an internal region. It also provides a metal framework, forming internal walls, supported by the outer wall, that divides the area interior of the seal ring's outer wall into separate metal walled compartments. A series of inner walls, 8, 10, and 12 as example, are supported by the outer wall within the interior region. The interior walls divide the interior regions into a number of separate compartments of varied size and shape to accommodate the separate RF circuit portions disposed on substrate 1. The internal walls in seal ring 5 also form or define two small rectangular windows 37, shown in FIGS. 1 and 3, that are essentially of the same size as the waveguide openings 17 in the metal base. Thin covers 16 are added to the seal ring to close those formed windows for reasons later herein described, not directly related to the novel RF pin grid array.

The interior walls serve to shield, more specifically shield from the side, the electronic circuit that is resident within a compartment from interfering RF radiation originating from another RF circuit located in a different compartment and vice-versa. When the module is fully packaged, an electrically conductive lid covers the seal ring and hermetically seals the elements within the confines of the seal's walls and serves as another shielding barrier to close the defined internal compartments. With a metal base and lid, each metal walled compartment is essentially RF isolated from adjacent compartments. This seal ring may be cast to the desired shape, avoiding machining operations.

Figure 4A:
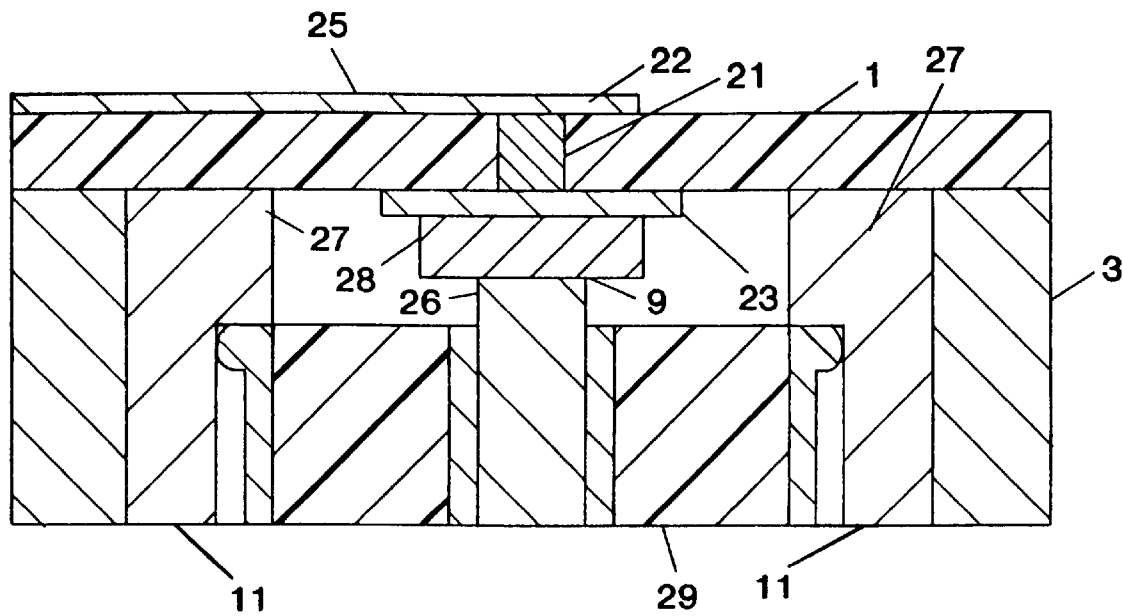
FIG. 4A is an enlarged not to scale section view of one of the RF pins used in the embodiment of FIG. 1

Reference is made to FIG. 4A, which illustrates a partial section view in an enlarged but not to scale size a portion of the multi-chip module about one of the shorter conductor pins 9, and shows the construction in greater detail. An electrical via 21 extends through the thickness of substrate 1, and provides a transmission path between pad 22, on the upper side of the substrate, and pin attach pad 23 on the underside of that substrate.

Figure 4B:
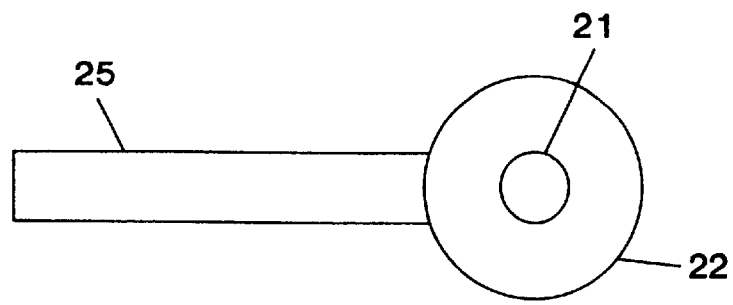
FIG. 4B is a top view of a portion of FIG. 4A.

Pad 22 is integral with a microstrip transmission line 25, typically 10 mils in width, and is patterned on the top side of substrate 1. Transmission line 25 extends to one of the RF circuits, not illustrated, attached to the substrate's upper surface. The transmission line 25 is illustrated in top view in FIG. 4B, which is a partial top view of the portion of the assembly illustrated in FIG. 4A, to which brief reference may be made. As formed on the substrate, the transmission line possesses a characteristic impedance, $Z_0$.

Conductor pin 9 has the geometry of a slender cylinder 26 with a larger, thin disk at one end. Because FIG. 4A shows pin 9, mated with RF connector 29, the remainder of the pin's length is not visible in the figure. The smaller diameter portion 26 is of a length of about fifty mils and the larger diameter portion 28, on top of portion 26, typically referred to as the "nailhead" of the pin, is about six mils thick. The larger diameter disk 28, as example, is about 30 mils diameter, and the cylinder 26 about 15 mils diameter. Pin 9 is soldered to pin attach pad 23, which places the pin in electrical contact with electrical via 21 to complete an RF transmission path.

Typically the electrical vias are smaller in diameter than the pads, as example an 8 mil diameter via compared to a diameter of 14 mils for pad 22 and 40 mils diameter for pad 23 on the underside of substrate 1. The passage formed in the metal base plate 3 is aligned coaxially with the electrical via 21. The cylindrical body of metal shroud 11 fits within that passage. The shroud's thick washer-shaped end 27 abuts the underside of substrate 1.

The characteristic impedance of the coaxial transmission line formed by conductor pin 9 and the disk shaped end of the metal shroud may be tailored by adjusting the width and shape of the pin as well as by adjusting the inner diameter of the shroud 11's washer shaped end. With that characteristic impedance desirably designed to be equal to the same characteristic impedance, $Z_0$, of microstrip transmission line 25. Matching those impedances as closely as possible, ensures that the VSWR is of the minimum value of 1 or as close to that value as possible, which, as is familiar to those skilled in the art, ensures maximum RF power transfer between the segments of the formed transmission line. Additional impedance matching is also achieved by tailoring the conductor pattern of pad 22 and the connecting transmission line 25.

At the open end, the metal shroud is sized to receive a conventional coaxial connector, such as the familiar Gilbert connector. That connector is designed to have the same characteristic electrical impedance $Z_0$, earlier referred to. The walls of the shroud may frictionally engage the outer walls of the connector to hold the latter in place. Alternatively the shrouds inner cylindrical wall may be threaded to engage and hold a threaded type coaxial connector. The use of shrouds often facilitates the manufacture of the base 3. However, in some instances shrouds are not used, and the internal shroud features are machined directly in the base.

The length and shape of the conductor pins used to couple DC current to the circuits from an external source may be of any desired shape since the shape is not important. Suitably it may be a straight cylinder that extends the length of the passage in the metal plate. A standard DC connector may be plugged into the passage, which forms a connector socket, and electrically connects to the associated DC conductor pin.

It should be noted that substrate 1 includes a ground plane conductor on each of its upper and lower surfaces, which are connected electrically in common by an electrical via, a known practice. The ground plane conductor layer on the bottom surface of the substrate covers essentially the entire bottom surface, except for the openings for the pins and shrouds, and excepting also the openings for the microstrip to waveguide transition, later herein described. In abutting the bottom surface, the metal base plate 3 contacts the ground plane conductor, and on the top side, the metal seal ring 5 contacts the other ground plane conductor. This places those elements electrically in common so they may be electrically grounded when placed in operation on a motherboard. The common ground on each side of the substrate also provides shielding of the RF fields generated during operation by the integrated circuit chips installed in the module.

In practice, the foregoing elements are formed into a multi-chip package. To complete a packaged multi-chip assembly with the foregoing elements, a lid, not illustrated is hermetically sealed at least to the upper edge of the seal rings outer wall, whereby the internal region containing the circuitry and microelectronic chips on the upper surface of the substrate is bounded on all six sides, hermetically sealed and shielded from external gases.

The foregoing pin grid array permits the multi-chip module package to be compact; formed essentially as a sandwich of base plate, substrate, seal ring and lid. As an additional feature to the module and as an adjunct to the novel pin grip array structure described, the preferred embodiment also includes a novel microstrip to waveguide transition structure that may be integrally formed into such sandwich configuration for those modules for applications requiring rectangular waveguide connections. Such microstrip to waveguide transitions are included in the foregoing embodiment at two spaced locations, earlier briefly mentioned with the introduction of the integrally formed waveguides 17 in FIGS. 1 and 2. Reference is made to the exploded view of the uncovered module illustrated in FIG. 5, which illustrates the right most corner of the embodiment of FIG. 3, containing one of the microstrip to waveguide transitions, in an enlarged view, with cover 16 and/or the module lid removed, and also corresponds to the upper right corner of the exploded view of FIG. 1, also in larger scale, but with cover 16 removed.

As illustrated metal patch 18 is formed on the upper surface of substrate 1 is essentially of rectangular shape and is disposed within an essentially rectangular shaped area or window 31 of exposed dielectric of the substrate's surface. Metal patch 18 connects to a thin conductor 33 that functions as a microstrip transmission line to other elements, not illustrated, in the module. Window 31 is framed by a conductor 35, more accurately, a C-shaped frame, which allows a path through the frame for the line 33, extending to metal patch 18. As illustrated in this exploded view, dielectric window 31 overlies the end of rectangular waveguide 17 and is aligned therewith.

A corresponding rectangular shaped window opening 37 formed in seal ring 5 is essentially of the same size and area as conductor 35. It too is aligned with window 31 and overlies that window. The seal ring is of a predetermined thickness. At the short wavelengths contemplated for operation of the preferred embodiment, the seal rings thickness is significant with respect to that wavelength. Thus with a metal cover 16 or any other metal wall placed over window 37 within the seal ring at a predetermined depth, a shallow metal walled resonant cavity is formed. With the seal ring, substrate and base plate sandwiched together in assembled relationship, that resonant cavity is placed on the upper side of the metal patch 18.

Figure 6:
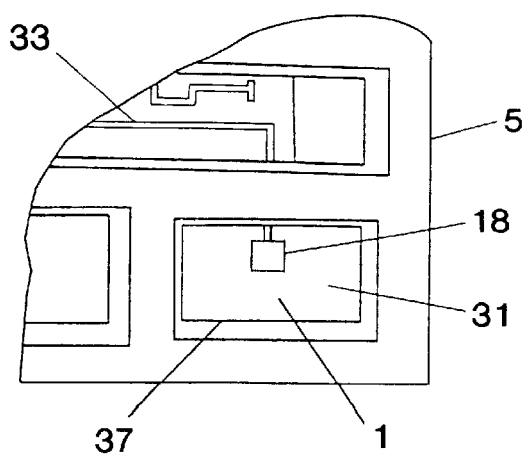
FIG. 6 illustrates the view of FIG. 5 as viewed from the top side.
Figure 7:
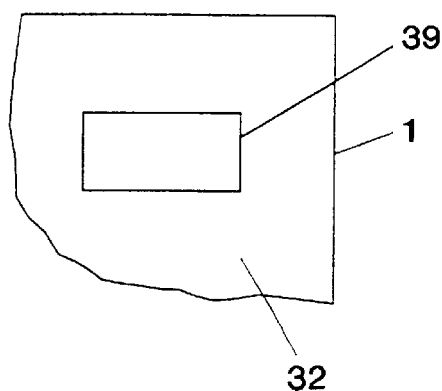
FIG. 7 is a partial view of the underside of the module substrate at the corner of the module illustrated in FIG. 6.

As illustrated in the top partial view of FIG. 6, the rectangular shaped area or window 31 of dielectric material on the top surface of substrate 1 is aligned with and underlies the rectangular window 37 formed in seal ring 5. The conductor metal patch 18 is of a rectangular shape and covers only a small portion of the area of window 31 on the substrate. The underside surface of substrate 1 at the same location is illustrated in FIG. 7. As there shown the underside surface of substrate 1 is covered by metal layer 32, excepting the rectangular shaped window area 39 on the underside. The latter area is aligned with the window on the top side of the substrate.

As earlier described, within seal ring 5 in FIG. 6 when fully assembled is created a resonant microwave cavity on the upper side of the substrate. The length, width and spacing of the metal patch 18, backside opening 39, and the size of the cavity are adjusted in size through design and trial to ensure that the microwave energy applied from a microstrip transmission line satisfactorily propagate into the rectangular waveguide and excite electrical fields in the waveguide, suitably in the principal propagation or $TE_{01}$ mode and that the VSWR between the transition and microstrip line 33 is as low as possible. It is appreciated that the foregoing configuration defines a novel microstrip to rectangular waveguide transition that is integrally formed in the module and does not detract from the module's compact size.

Each of the principal elements of the multi-chip module package, namely the ring seal, the lid, and the substrate should possess thermal expansion characteristics that are matched as closely as possible. Typically, when the substrate is of alumina material, both the lid and the seal ring are formed of a metal, suitably the well known Alloy 46 or Kovar, which possesses thermal expansion characteristics that closely match the thermal expansion characteristics of the alumina substrate.

When completely assembled in the package, the metal lid and metal base 3 provide comparable shielding on the top and bottom sides of the compartment and, hence, the electronic circuit is confined in the formed compartment. That shielding isolates the RF energy that may be created in one compartment from passing into and causing interference with the devices in any adjacent compartment. The size and shape of those compartments and, hence the internal walls, is governed by the geometry and size of the electronic components and circuitry located on the circuit substrate.

Although the foregoing embodiment contains only three RF pins, it is appreciated that greater numbers of RF pins may be included and all such pluralities of spacially arranged pins of two or more RF pins may be referred to as an array. Further, it is recognized that other conductive pins are also spacially arranged over the substrate surface to provide DC transmission paths. They also form an array, though not an RF pin grid array. That pin array is interspersed with the former RF pin grid array. For convenience, and in the context of this specification and claims, it is preferred to refer to any pin grid array that contains some RF pins, as an RF pin grid array, even though the array contain other pins which carry only DC voltages.

Those skilled in the art recognize the distinction between the foregoing package and the comparable package used in present industrial practice. Such prior package contained a metal base of much greater thickness in which the compartments defined by the walls of seal ring 3 were machined out of, that is, cut out from the top end of the metal base. That produced a much heavier base or housing. Because of the machining necessary, it was more expensive to produce.

Further, conventional feed throughs, specifically glass type DC and RF feed throughs were formed in feed through passages drilled through that metal base. The feed through's pins projected up into the respective compartments for connection to a respective substrate and had to be wired and soldered to the appropriate circuit junctures on the substrate when the latter was installed. However, because of the foregoing construction, it was not possible to use a single substrate. A circuit substrate was fabricated for each individual compartment. After the respective microelectronic chips were assembled to the appropriate substrate, the individual circuit substrate assemblies were individually dropped into place within its respective compartment. Thereafter the projecting feed through pins were wired to the respective terminals on the respective substrate. One then had a greater parts count and a more complex assembly procedure than with the present invention.

It is appreciated, thus, that the invention offers a more simple and more easily manufactured RF multi-chip package than before. Through elimination of glass feed throughs, the elements of the package and the package may be handled more vigorously than the prior package design, reducing the manufacturing costs and, through increased yield, reducing the manufacturing time.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A multi-chip module, comprising:

a substrate for supporting a plurality of RF electronic circuits; said substrate comprising a dielectric material, a rigid physical characteristic, and a flat geometry;

said substrate including a first ground plane conductor on an upper surface and a second ground plane conductor on a bottom surface, said second ground plane conductor being connected to said first ground plane conductor to place said ground plane conductors electrically in common;

said substrate further including a first plurality of electrical vias extending through said substrate;

a metal seal ring;

said metal seal ring being attached to an upper surface of said substrate in contact with said first ground plane conductor;

said metal seal ring providing a peripheral wall about an upper surface of said substrate for walling in a predefined region of said substrate's upper surface, said seal ring further providing a plurality of subsidiary walls connected to said peripheral wall and located in said predefined region for dividing said predefined region into a plurality of separate compartments;

said first plurality of electrical vias being spacially distributed about said substrate to define a first spacial array of vias, and wherein at least one of said plurality of separate compartments contains at least one of said plurality of electrical vias;

said substrate further including a plurality of electrical transmission lines, said transmission lines being distributed amongst said separate compartments; at least one of said plurality of transmission lines being electrically connected to respective ones of a first portion of said plurality of electrical vias, each of said transmission lines having a characteristic impedance $Z_0$;

a first plurality of conductive pins of a first predetermined length; said first plurality of pins having a first end attached to respective ones of said first portion of said plurality of electrical vias, leaving a second end thereof extending from said substrate;

a second plurality of conductive pins of a second predetermined length; said second plurality of conductive pins having a first end attached to respective ones of a second portion of said plurality of electrical vias, leaving a second end thereof extending from said substrate;

a metal base plate, said metal base plate being positioned in abutment with an underside surface of said substrate in contact with said second ground plane conductor to place said metal base plate, said second ground plane conductor, said first ground plane conductor and said seal ring electrically in common;

said metal base plate including a plurality of passages there through, said passages in said metal base plate being spatially distributed about said base plate in said spacial array, wherein said passages are in alignment with said electrical vias;

said passages in said metal base plate being of a third predetermined length, said third predetermined length being greater than said first and second predetermined lengths, wherein said first and second plurality of conductive pins are received within respective ones of said passages in said metal base plate and said second end of said first plurality of conductive pins is positioned within an associated one of said passages in said metal base plate;

a plurality of metal shrouds, each comprising a hollow cylindrical portion, and a washer shaped end to said cylindrical portion, defining a central circular opening; and said plurality of metal shrouds being positioned within those of said passages in said metal base plate containing conductive pins from said first plurality of conductive pins for surrounding said conductive pins without physical contact therebetween;

each said shroud and associated conductive pin defining a coaxial transmission line having a characteristic impedance of said $Z_0$.

2. The invention as defined in claim 1, wherein said metal base plate includes a plurality of waveguide passages for conducting RF energy; wherein said plurality of compartments defined by said seal ring includes a second plurality of compartments, corresponding in number to said plurality of waveguide passages; said second plurality of compartments overlying respective ones of said waveguide passages in said base plate; wherein said substrate that is sandwiched between said seal ring and said base plate includes patterned metal conductors on said top surface of said substrate overlying respective waveguide passages, said patterned metal conductors covering a predetermined area smaller in size than the cross-sectional area of said waveguide passage, leaving a passage through said dielectric substrate for coupling microwave energy through said substrate into a respective waveguide, whereby said patterned metal conductors, said substrate and said respective compartment defines a microstrip line to waveguide transition.

3. The invention as defined in claim 1, wherein each of said first plurality of conductive pins comprise:

a nailhead pin shaped geometry, including:
  a nailhead disk shaped portion of a first predetermined diameter and a first predetermined thickness; and
  a second cylinder shaped portion of a second predetermined diameter, smaller than said first predetermined diameter, and of a second predetermined length; said second cylinder portion being continuous with and oriented coaxial with said first disk portion.

4. The invention as defined in claim 3, further comprising:

a plurality of pin attach pads attached to said bottom surface of said substrate, each of said plurality of attach pads being associated with a respective one of said electrical vias;

said attach pads being of a disk shaped geometry; each said attach pad being oriented coaxial with and in electrical contact with a bottom end of a respective one of said first and second portions of electrical vias;

each said attach pad being of a third predetermined diameter and third predetermined thickness;

said third predetermined diameter being greater than said second predetermined diameter; and wherein said conductive pins are attached to said electrical vias indirectly through said attach pads.

5. The invention as defined in claim 4, wherein said metal base plate includes a plurality of waveguide passages for conducting RF energy; wherein said plurality of compartments defined by said seal ring includes a second plurality of compartments, corresponding in number to said plurality of waveguide passages; said second plurality of compartments overlying respective ones of said waveguide passages in said base plate; wherein said substrate that is sandwiched between said seal ring and said base plate includes patterned metal conductors on said top surface of said substrate overlying respective waveguide passages, said patterned metal conductors covering a predetermined area smaller in size than the cross-sectional area of said waveguide passage, leaving a passage through said dielectric substrate for coupling microwave energy through said substrate into a respective waveguide, whereby said patterned metal conductors, said substrate and said compartment defines a microstrip line to waveguide transition.

6. A multi-chip module, comprising:

a substrate for supporting a plurality of RF electronic circuits; said substrate comprising a dielectric material;

said substrate further including a first plurality of electrical vias extending through said substrate;

a metal seal ring;

said metal seal ring being attached to an upper surface of said substrate;

said metal seal ring providing a peripheral wall about an upper surface of said substrate for walling in a predefined region of said substrate's upper surface, said seal ring further providing a plurality of subsidiary walls connected to said peripheral wall and located in said predefined region for dividing said predefined region into a plurality of separate compartments;

said first plurality of electrical vias being spacially distributed about said substrate to define a first spacial array of vias, and wherein each of said plurality of separate compartments contains at least one of said plurality of electrical vias;

said substrate further including a plurality of electrical transmission lines, said transmission lines being distributed amongst said separate compartments; each of said plurality of transmission lines being electrically connected to respective ones of a first portion of said plurality of electrical vias, each of said transmission lines having a characteristic impedance $Z_0$;

a first plurality of conductive pins of a first predetermined length; said first plurality of pins having a first end attached to respective ones of said first portion of said plurality of electrical vias, leaving a second end thereof extending from said substrate;

a second plurality of conductive pins of a second predetermined length; said second plurality of conductive pins having a first end attached to respective ones of a second portion of said plurality of electrical vias, leaving a second end thereof extending from said substrate;

a metal base plate, said metal base plate being positioned in abutment with an underside surface of said substrate;

said metal base plate including a plurality of passages therethrough, said passages in said metal base plate being spacially distributed about said base plate in said spacial array, wherein said passages are in alignment with said electrical vias;

said passages in said metal base plate being of a third predetermined length, said third predetermined length being greater than said first and second predetermined lengths, wherein said first and second plurality of conductive pins are received within respective ones of said passages in said metal base plate and said second end of said first plurality of conductive pins is positioned within an associated one of said passages in said metal base plate;

a plurality of metal shrouds, each comprising a hollow cylindrical portion, and a washer shaped end to said cylindrical portion, defining a central circular opening; and said plurality of metal shrouds being positioned within those of said passages in said metal base plate containing conductive pins from said first plurality of conductive pins for surrounding said conductive pins without physical contact there between;

said metal base plate including a plurality of waveguide passages for conducting RF energy;

said plurality of compartments defined by said seal ring including a second plurality of compartments, corresponding in number to said plurality of waveguide passages;

said second plurality of compartments overlying respective ones of said waveguide passages in said base plate;

said substrate sandwiched between said seal ring and said base plate includes patterned metal conductors on said top surface of said substrate overlying respective waveguide passages, said patterned metal conductors covering a predetermined area smaller in size than the cross-sectional area of said waveguide passage, leaving a passage through said dielectric substrate for coupling microwave energy through said substrate into a respective waveguide, whereby said patterned metal conductors, said substrate and said compartment defines a microstrip line to waveguide transition.

\* \* \* \* \*